United States Patent [19]

Thomas

[11] 4,356,449
[45] Oct. 26, 1982

[54] LOGARITHMIC ATTENUATING CIRCUIT

[75] Inventor: Paul L. Thomas, Loveland, Colo.

[73] Assignee: Hewlett-Packard Company, Palo Alto, Calif.

[21] Appl. No.: 135,952

[22] Filed: Mar. 31, 1980

[51] Int. Cl.³ .............................................. G06G 7/24
[52] U.S. Cl. ................................... 328/145; 307/492; 307/562; 328/144
[58] Field of Search ............... 307/492, 493, 494, 553, 307/562, 565; 328/144, 145

[56] References Cited

U.S. PATENT DOCUMENTS

| | | | |
|---|---|---|---|
| 3,206,620 | 9/1965 | Freeman et al. | 307/492 |
| 3,361,975 | 1/1968 | Rorden et al. | 328/145 |
| 3,502,959 | 3/1970 | Stellman | 307/492 |
| 3,562,552 | 2/1971 | Baudino, Jr. et al. | 307/492 |
| 3,629,617 | 12/1971 | McGowan | 307/492 |

Primary Examiner—John Zazworsky
Attorney, Agent, or Firm—John A. Frazzini

[57] ABSTRACT

A logarithmic attenuating circuit is disclosed for multiplying by a constant factor the logarithmic range of input voltages which can be accomodated by a variety of test equipment. The circuit functions as an amplifier having a gain which varies inversely with the root mean square of the output voltage. The effect of the circuit is to produce from the a.c. component of an input signal, an output signal having the same shape as the input signal but an amplitude of its a.c. component proportional to the n-th of the amplitude of the a.c. components of the input signal.

9 Claims, 7 Drawing Figures

LOGARITHMIC ATTENUATING CIRCUIT

BACKGROUND AND SUMMARY OF THE INVENTION

This invention pertains, in general, to attenuators and, in particular, pertains to a logarithmic attenuating circuit for expanding by a constant factor the logarithmic range of input voltages which can be accommodated by a variety of test equipment.

Testing devices for measuring and analyzing input signals are limited in the range of input voltages which can be accommodated without damaging the device or exceeding the full scale range of the device. Typically, an attenuator is provided at the input port of the testing device to expand the range of signals which can be tested.

An attenuator can be constructed from passive elements such as the attenuators shown in FIGS. 1 and 2. The three degrees of freedom in selecting the impedances enables the attenuator to be designed to attenuate the input signal by a selected attenuation factor as well as to match the output impedance of the circuit tested with the input impedance of the testing device. An attenuator can be constructed using active elements such as the variable gain amplifier shown in FIG. 3 in which the gain can be varied by selecting which of the impedances $Z_2, Z_3, Z_4 \ldots$ or $Z_n$ is to be used as the input impedance. Alternatively, the feedback impedance $Z_1$ in FIG. 3 can be varied to alter the gain. These attenuators perform analogously in that all of them alter the linear range of allowed input voltages by a selected factor. If a wide range of input voltages is to be tested, then a network of switches and impedances is required to vary the attenuation factor. These switches must either be controlled by the user of the testing device or must be controlled by additional complex sensing and control circuitry.

An object of the disclosed invention is to increase the logarithmic range of the testing device by a fixed factor rather than just increasing the linear range by a fixed factor. Another object is to avoid the use of complicated sensing circuitry, switch and resistor networks, and switch control circuitry required in attenuators analogous to that shown in FIG. 3.

The disclosed invention presents a logarithmic attenuating circuit which produces, from an input signal, an output signal having the same shape as the input signal but an amplitude which is proportional to the square root of the root mean square (RMS) of the input signal. This circuit, when coupled to the input of a testing device, therefore doubles the logarithmic range of the testing device. The circuit functions as an amplifier having a gain which is inversely proportional to the RMS of the output signal. In one embodiment this gain is achieved by employing an operational amplifier having a feedback impedance with varies inversely with the RMS of the output signal. The value of the feedback impedance is regulated by passing through the feedback impedance a signal proportional to the RMS of the output signal while concurrently maintaining constant the d.c. component of the voltage drop across the feedback impedance. A photocell can be employed as the feedback impedance to ensure that the a.c. gain as well as the d.c. gain of the circuit vary inversely with the RMS of the output voltage.

DESCRIPTION OF THE PREFERRED EMBODIMENTS

In accordance with the disclosed preferred embodiment, a logarithmic attenuating circuit is disclosed which produces, from an input signal, an output signal having the same shape as the input signal, but having an amplitude which is proportional to the square root of the root mean square (RMS) of the input signal. Such a circuit can be used to double the decibel range of a variety of circuits including, for example, a.c. voltmeters and general wave analyzers.

In general, many input signals of interest can be divided into a d.c. signal which varies slowly with time plus an a.c. signal which varies much more rapidly with time. Even though a slowly varying d.c. signal is actually the sum of low frequency sine waves, such signals will be referred to herein as the d.c. component of the signal. Likewise, the high frequency component of a signal (i.e., the signal minus its d.c. component) will be referred to as the a.c. component. Because the d.c. and a.c. components perform different functions in the circuit, the d.c. components will be represented by capital letters, the a.c. components will be represented by underlined lower case letters and the RMS of the a.c. components will be represented by the non-underlined lower case letter of its corresponding a.c. component. In particular, the input signal can be broken into its d.c. voltage component $E_i$ and its a.c. voltage component $\underline{e}_i$. The output signal can be broken into its d.c. component $E_o$ and its a.c. component $\underline{e}_o$. The RMS values of $\underline{e}_i$ and $\underline{e}_o$ are denoted by $e_i$ and $e_o$, respectively.

The disclosed logarithmic attenuating circuit functions as an amplifier having a gain G which is inversely proportional to $e_o$. Such a result makes $e_o = G e_i = k e_i / e_o$ (where k is constant) so that $e_o$ is proportional to the square root of $e_i$.

Figure 1:
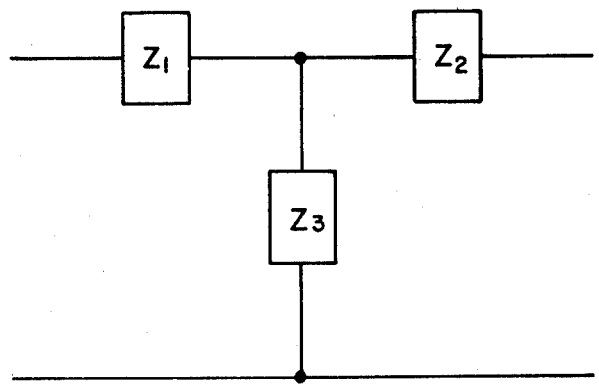
FIG. 1 shows a prior art T-type attenuator.
Figure 2:
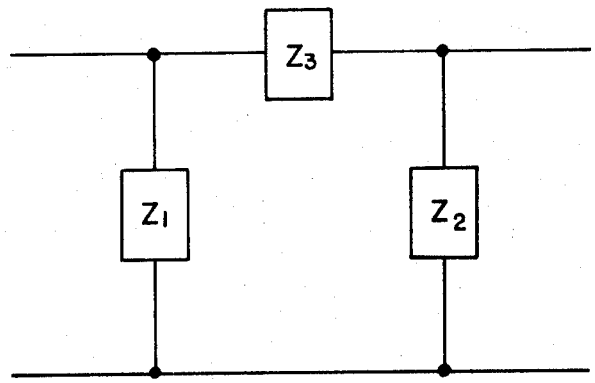
FIG. 2 shows a prior art $\pi$-type attenuator.
Figure 3:
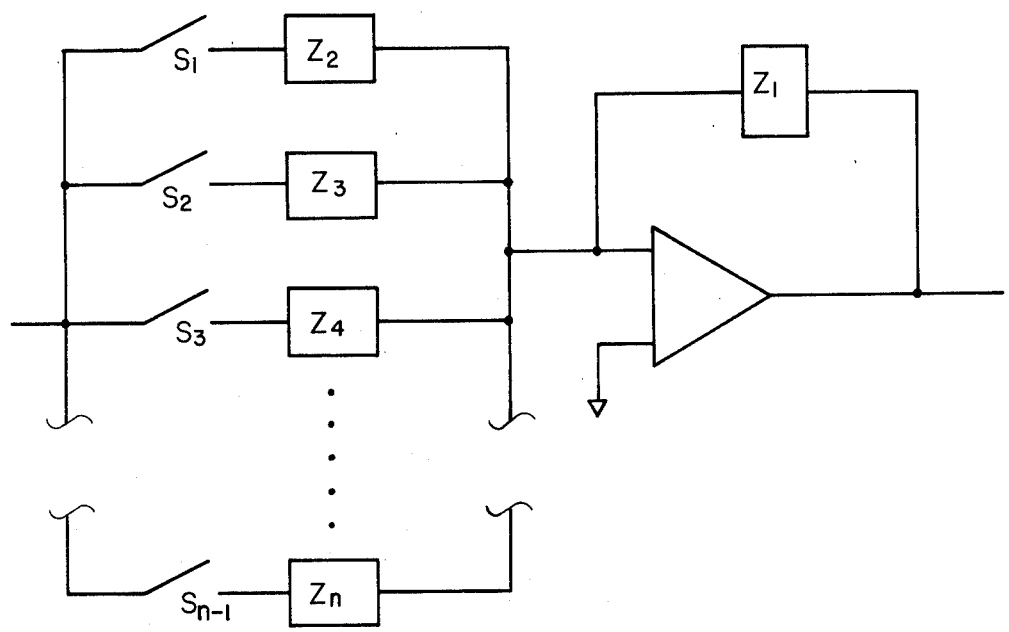
FIG. 3 shows a prior art active attenuator.
Figure 4A:
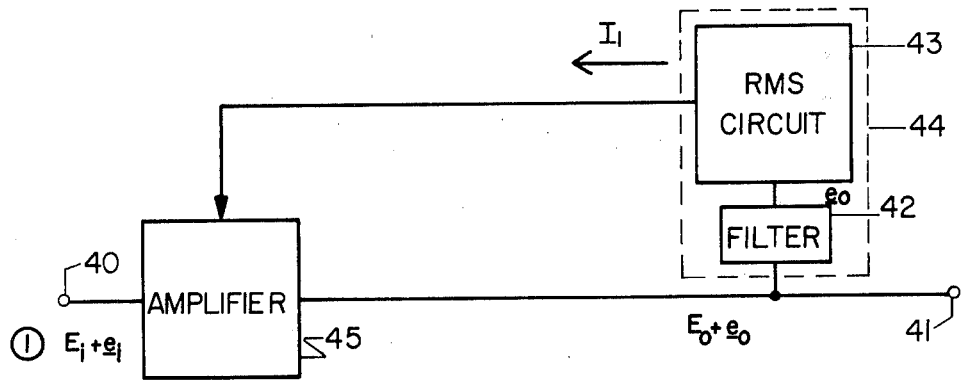
FIGS. 4A–4C show in increasing detail the structure of a logarithmic range doubling attenuator in accordance with the disclosed invention.

As shown in FIG. 4A, the gain regulation is effected by generating an RMS current $I_1$ proportional to $e_o$. A first filter 42 blocks the d.c. component $E_o$ so that an RMS circuit 43 such as the AD536A produced by Analog Devices, produces the RMS current $I_1$ proportional to $e_o$. The Fourier spectrum of $\underline{e}_o$ and the averaging time of the RMS circuit are assumed to be such that this RMS current has a neglibible a.c. component—in general, such conditions will be true for non-pulse-like signals typically analyzed by a.c. voltmeters and wave analyzers. The combination 44 of filter 42 and RMS circuit 43 thus functions to produce a d.c. current proportional to $e_o$. The gain G of an amplifier 45 is varied inversely with the RMS current $I_1$ so that the amplitude of the a.c. component of the output signal at output port 41 is proportional to the square root of the amplitude of the a.c. component of the input signal at input port 40.

Figure 4B:
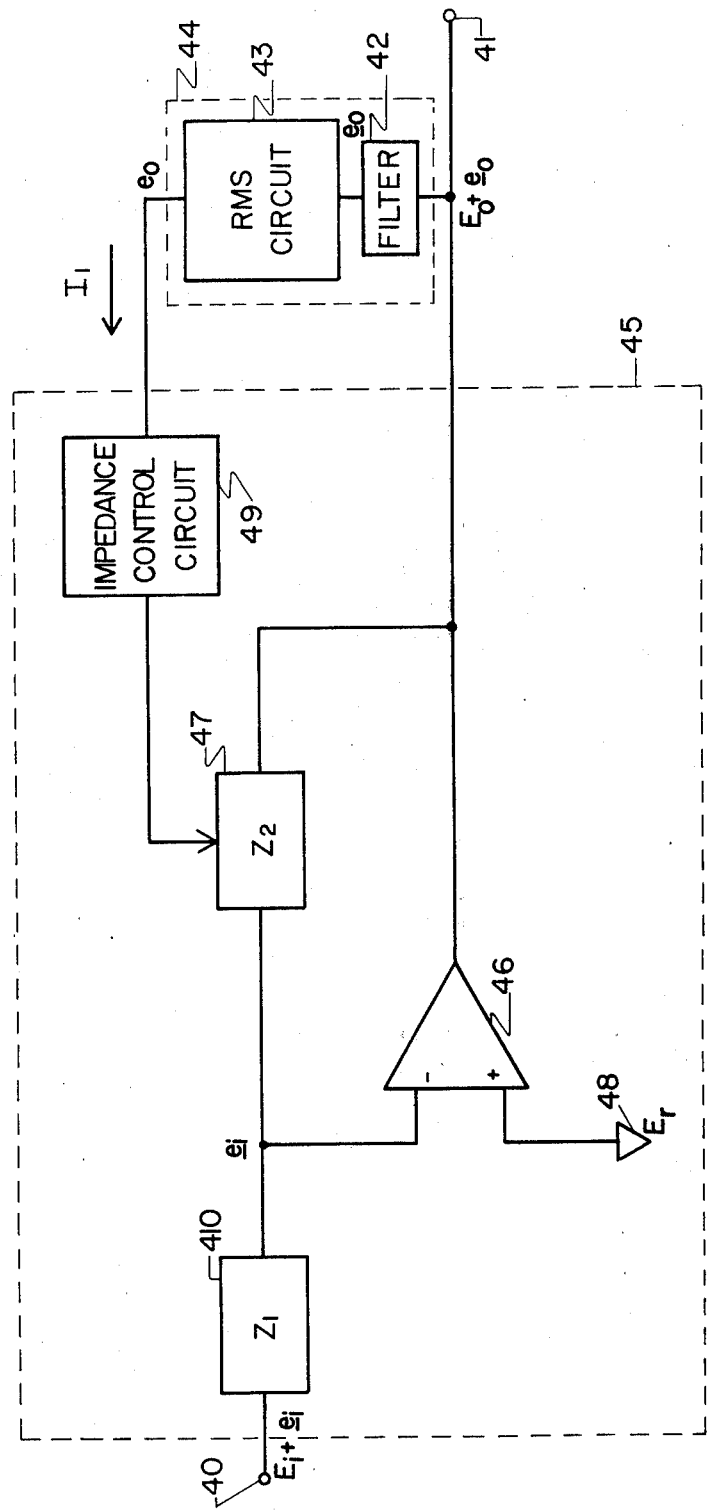

As shown in FIG. 4B amplifier 45 comprises an operational amplifier 46 having its non-inverting input connected to a first reference voltage source 48 of voltage $E_r$, its inverting input connected to input port 40 via a fixed input impedance 410, and its output connected to output port 41 and to the input of filter 42. A variable impedance element 47 provides feedback from the output of operational amplifier 46 to its inverting input. This combination 45 of circuit elements functions as an amplifier having a gain G proportional to the impedance $Z_2$ of element 47. Amplifier 45 further comprises an impedance control circuit 49 which, in response to the RMS current $I_1$ from RMS combination 44, regulates the impedance $Z_2$ of element 47 to be inversely proportional to $I_1$ and consequently varies the gain G of amplifier 45 inversely as $I_1$.

Figure 4C:
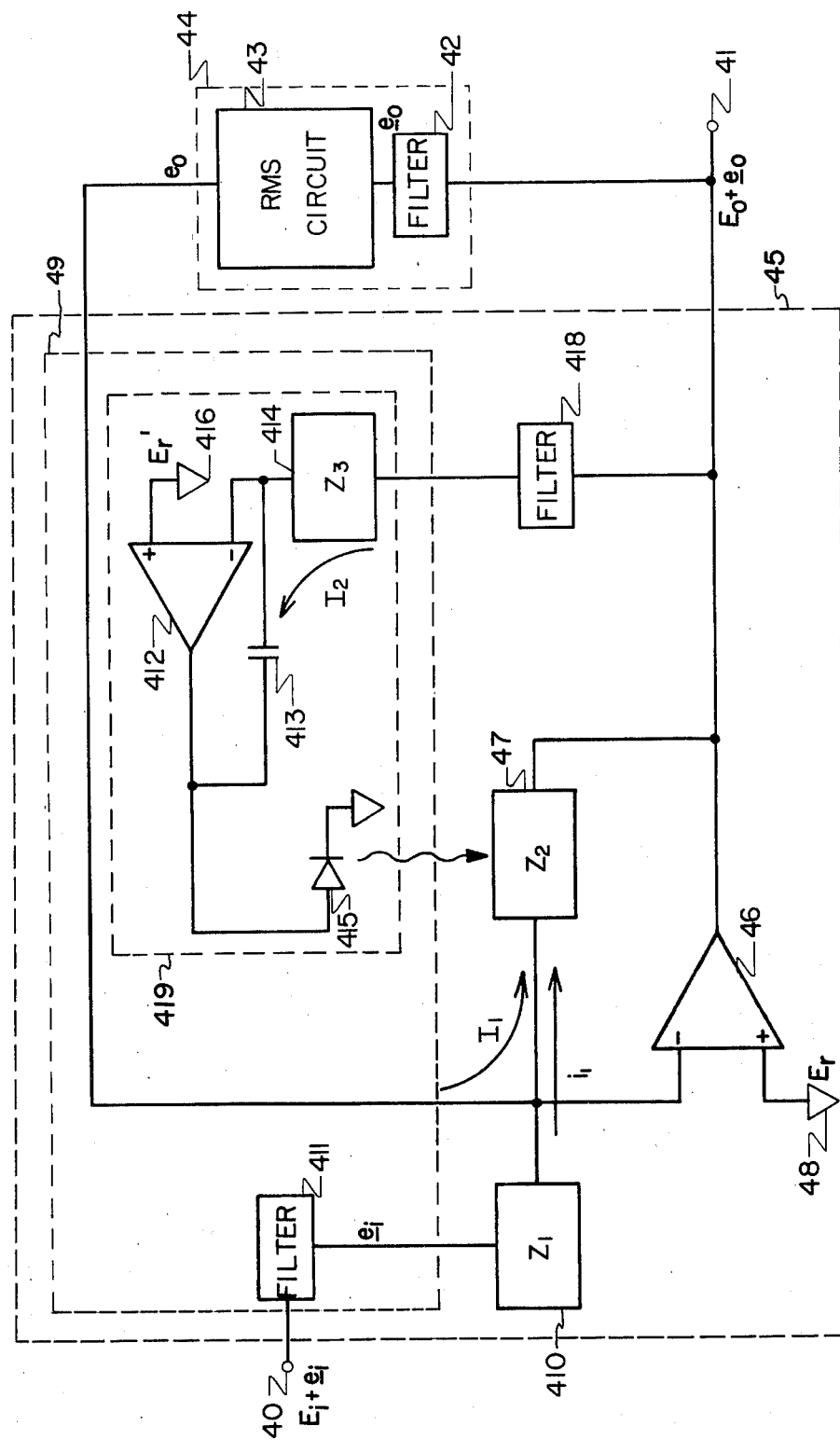

The regulation of the variable impedance $Z_2$ can be accomplished by a circuit as shown in FIG. 4C. A second filter 411 is included between input port 40 and the inverting input of amplifier 45 to block the d.c. component of the input signal. Because of filter 411, the input current $i_1$ has no d.c. component. The RMS circuit combination 44 is connected to the inverting input of operational amplifier 46 so that the d.c. current through variable impedance 47 is $I_1$. Impedance control circuit 49, which is connected from the output of RMS circuit combination 44 to variable impedance element 47, supplies $I_1$ through variable impedance element 47 and maintains a constant d.c. voltage drop across element 47 so that its impedance $Z_2$ varies inversely as $I_1$.

A particular choice of variable impedance element 47 is a photocell having an impedance which can be varied by controlling the amount of light incident on the photocell. Impedance control is effected by use of an integrator formed from an operational amplifier 412 having negative feedback provided by a capacitor 413 and having an input impedance element 414 connecting its inverting input to output port 41. Because operational amplifier 412 draws no input current, the current through impedance element 414 flows into capacitor 413. Under the assumption that the d.c. component varies much more slowly with time than the a.c. component, capacitor 413 discriminates against the a.c. component so that the current through impedance element 414 is essentially a d.c. current $I_2$. The voltage change across capacitor 413 resulting from current $I_2$ adjusts the voltage applied to light emitting diode (L.E.D.) 415. This, in turn, varies the amount of light emitted by L.E.D. 415 onto photocell 47 and consequently varies the resistance $R_p$ of the photocell. The non-inverting input of operational amplifier 412 is coupled to a reference voltage source 416 so that $R_p$ is varied to hold the d.c. component of the voltage on output port 41 at the voltage of reference voltage source 416. Thus, the combination of elements 419 controls the impedance of variable impedance element 47 to hold constant the d.c. component $E_o$ of the output voltage.

Typical photocells have resistances which can vary over several decades of resistance and are strongly varying functions of the incident light intensity. In addition, impedance element 414 and capacitor 413 can be chosen to be small so that very small variations in $e_o$ can adjust $R_p$ over a wide range of resistance. The feedback loop through L.E.D. 415 produces negative feedback so that if current $I_1$ is changed, then $R_p$ quickly adjusts to a new stable value. The combination of capacitor 413 and amplifier 412 functions as an integrator so that the new stable value of $R_p$ must produce zero d.c. current through impedance 414. This, in turn, requires for all values of $I_1$ that $E_o$ equal the voltage $E_r'$ of reference voltage source 416 of operational amplifier 412 and makes $R_p$ equal to $(E_r - E_r')/I_1$.

Because the d.c. impedance of a circuit can differ from its a.c. impedance some care must be taken in the design of variable impedance element 47. Proper circuit function requires that the circuit a.c. gain vary inversely with $e_o$. This, in turn, requires in the circuit of FIG. 4B that element 47 have an a.c. impedance which varies inversely with $I_1$. However, the circuit shown in FIG. 4B only makes the d.c. impedance of element 47 vary inversely with $I_1$. Care must therefore be taken in the design of element 47 to ensure that its a.c. impedance is proportional to its d.c. impedance. This requires that $dE_{47}/dI_{47} = \alpha E_{47} I_{47}$ where $\alpha$ is constant and where $E_{47}$ and $I_{47}$ denote the voltage across and current through element 47. This, in turn, requires that $E_{47}$ vary as a power function of $I_{47}$ in the range of values of $I_{47}$ used in circuit operation.

A power relation between voltage and current is most simply and accurately achievable for linear circuit elements. Such linearity is achieved in the circuit of FIG. 4C by the use of a photocell 417 as impedance element 47. Photocell 417 therefore provides the advantage of being a linear device which can also be varied through a wide resistance range of small variations in $e_o$. The photocell also provides a resistive impedance so that a resistor can be used as the input impedance element 410 thereby producing a nearly frequency independent gain for the a.c. component of the input signal. Such frequency independent gain can more generally be achieved in the circuit of FIG. 4C by making $Z_2/Z_1$ be nearly frequency independent for the a.c. component of the input signal. For such flat frequency response of the circuit, $\underline{e}_o$ will have the same shape as $\underline{e}_i$ but will have an amplitude proportional to the square root of $e_i$.

If the input signals of interest include only signals whose Fourier transform divides into a low frequency component separated in frequency from a high frequency component, then capacitors can be employed as filters 42 and 411. If input signals of interest include signals whose Fourier transform does not divide into separate components, then such division into high and low frequency components can be artificially produced by employing high pass filters 42 and 411 which pass only signals having frequencies above a preselected frequency $f_s$ selected by the testing device user and by employing an RMS circuit having an integration time equal to $1/f_s$. In such a circuit, a third filter 418 that passes only signals having frequencies below the preselected frequency is included in the signal input path of L.E.D. 415. Such artificial division into high and low frequency (i.e. a.c. and d.c.) components is useful in those cases where only the high frequency part of the signal is of interest. The choice of $f_s$ is at the discretion of the testing device user and is determined primarily by the shape of the signals which he is investigating. Typically such signals will be roughly periodic so that the user will select $f_s$ to be smaller than the inverse of this period.

RMS circuit 43 can be replaced by any amplitude detector since, for a given shape of input signal, an amplitude detector will increase $e_o$ by a factor of $\beta$ if $\underline{e}_i$ is increased by a factor of $\beta$. The amplitude detector thus performs the same role as RMS combination 44 in FIG. 4A in providing an amplitude signal which is fed back to amplifier 45 to regulate the gain of amplifier 45. The relation that $e_o^2 = k e_i$ will continue to be true for any choice of amplitude detector and therefore the circuit will continue to increase the logarithmic (or decibel) range by a factor of 2. The factor k is independent of the amplitude of $e_i$, but does depend on the signal shape and type of amplitude detector employed.

Figure 5:
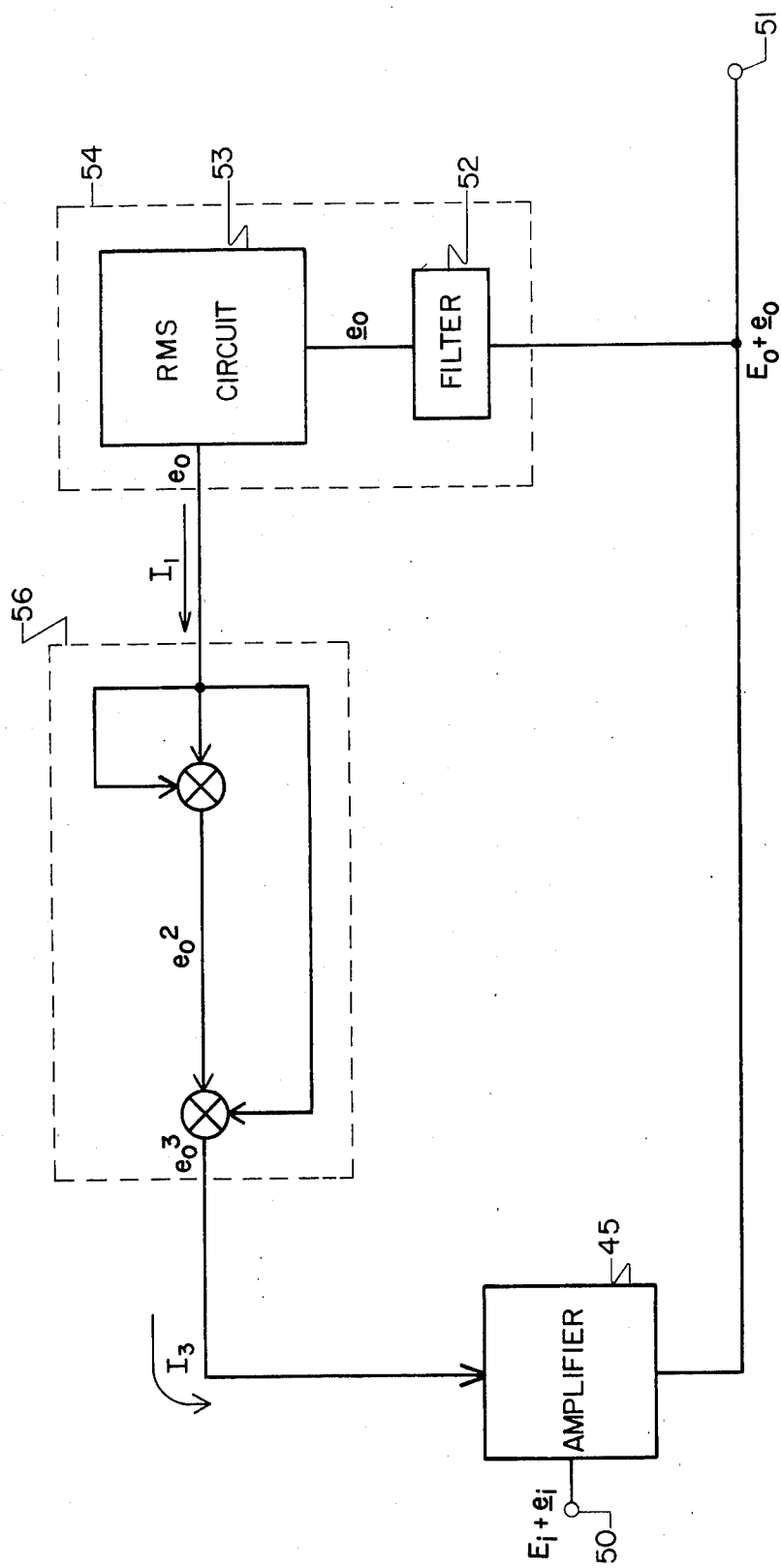
FIG. 5 shows an embodiment of the disclosed invention which can quadruple the logarithmic range of a testing device.

The logarithmic range can be increased by integral factors other than 2 by including a set of multipliers in the feedback path from RMS circuit 43 to amplifier 45 as shown, for example, in FIG. 5. For the case of two multipliers, as shown in FIG. 5, the output of the RMS circuit is applied to both inputs of a first multiplier to produce a first multipier output proportional to $e_o^2$. The first multiplier output is applied to one input of a second multiplier and the output of the RMS circuit is applied to the other input of the multiplier to produce a feedback current $I_3$ which is proportional to $e_o^3$ thereby producing a fourfold increase in the logarithmic range of a testing device. In general, if a set of multipliers are added to the feedback path to produce a current $I_3$ proportional to a constant integral power $n-1$ of $e_o$ (i.e. a current proportional to $e_o^{n-1}$) then the gain G of amplifier 45 is inversely proportional to $e_o^{n-1}$. Such a result makes $e_o = Ge_i = ke_i/e_o^{n-1}$ (where k is a constant) so that $e_o$ is proportional to the nth root of $e_i$ (i.e. $e_i^{1/n}$) thereby expanding by the factor n the logarithmic range of a device utilizing this attenuator.

I claim:

1. A logarithmic attenuating circuit comprising:
   an input port for receiving an input signal;
   an output port;
   an a.c. amplitude detector having an input connected to said output port and an output for providing an amplitude signal proportional to the amplitude of the a.c. component of an output signal present at said output port; and
   an amplifier having an input connected to said input port and an output connected to said output port, said amplifier being responsive to said amplitude signal for producing a gain which is inversely proportional to the amplitude of said amplitude signal, to provide at said output port an output signal having the same shape as the input signal at the input port and having an a.c. component having an amplitude proportional to the square root of the amplitude of the a.c. component of said input signal.

2. The attenuator of claim 1 wherein said RMS circuit means includes a first filter, in the input signal path from said output port, for passing only signals above a preselected frequency.

3. The attenuator of claim 1 wherein said amplifier comprises:
   a first reference voltage source;
   an operational amplifier having an inverting input connected to said input port, a non-inverting input connected to said first reference voltage source, and an output connected to said output port;
   a variable impedance element connecting said output of the operational amplifier to said inverting input of the operational amplifier, said variable impedance having a control port for input of signals to control the value of its impedance; and
   impedance control means responsive to said amplitude signal and connected to said control port of the variable impedance element for regulating the impedance of said variable impedance element to be inversely proportional to said amplitude signal.

4. The attenuator of claim 3 wherein said impedance control means includes:
   a second filter in the signal path from said input port to said inverting input of the operational amplifier for passing only signals above a preselected frequency;
   means, connected to said inverting input of the amplifier for supplying through said variable impedance element a current proportional to the amplitude signal; and
   means, connecting said output port to said control port of the variable impedance element, for holding constant the d.c. component of the output voltage.

5. The attenuator of claim 4 wherein:
   said variable impedance element includes a photocell; and
   said means for holding constant the d.c. component of the output voltage comprises:
   (a) a second reference voltage source,
   (b) an integrator having an inverting input connected to said output port, a non-inverting input connected to said second reference voltage source and an output for providing a signal proportional to the integral of the difference between said output signal and the voltage of said second reference voltage source, and
   (c) a light emitting diode, connected to said output of the integrator, for emitting onto said photocell a beam of light of intensity which increases with increase in the voltage of said output of the integrator.

6. The attenuator of claim 5 further comprising a third filter in the signal path from said output port to said inverting input of the integrator for passing only signals having frequencies below a preselected frequency.

7. A logarithmic attenuating circuit as recited in claim 1 wherein the a.c. amplitude detector comprises an RMS circuit having an input connected to the output port to produce an amplitude signal proportional to the root mean square of the a.c. component of the output signal.

8. A logarithmic attenuating circuit comprising:
   an input port for receiving an input signal;
   an output port;
   an amplifier having an input connected to the input port and an output connected to the output port for amplifying the input signal to produce at the output port an output signal having an a.c. component $e_o$; and
   means, responsive to $e_o$, for providing a feedback signal proportional to a constant power $n-1$ of the amplitude of $e_o$, said amplifier being responsive to said feedback signal for producing a gain which is inversely proportional to the feedback signal, whereby the output signal has the same shape as the input signal and has an a.c. component having an amplitude which is proportional to the n-th root of the amplitude of the a.c. component of the input signal.

9. A logarithmic attenuating circuit as recited in claim 8 wherein the means for providing a feedback signal comprises:
   an a.c. amplitude detector connected to the output port to provide an amplitude signal proportional to the amplitude of $e_o$; and
   means, responsive to the amplitude signal, for producing a feedback signal proportional to a constant power $n-1$ of the amplitude signal.

* * * * *